US012283542B2

(12) United States Patent
Takeno et al.

(10) Patent No.: US 12,283,542 B2
(45) Date of Patent: Apr. 22, 2025

(54) POWER SUPPLY LINE ARRANGEMENT HAVING POWER SWITCH CIRCUIT

(71) Applicant: Socionext Inc., Kanagawa (JP)

(72) Inventors: Hirotaka Takeno, Yokohama (JP);
Atsushi Okamoto, Yokohama (JP);
Toshio Hino, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 542 days.

(21) Appl. No.: 17/577,994

(22) Filed: Jan. 18, 2022

(65) Prior Publication Data

US 2022/0231053 A1 Jul. 21, 2022

(30) Foreign Application Priority Data

Jan. 19, 2021 (JP) .................................. 2021-006440

(51) Int. Cl.
*H01L 23/528* (2006.01)
*H01L 23/522* (2006.01)
*H10D 89/10* (2025.01)

(52) U.S. Cl.
CPC ...... *H01L 23/5226* (2013.01); *H01L 23/5286* (2013.01); *H10D 89/10* (2025.01)

(58) Field of Classification Search
CPC .............. H01L 23/5226; H01L 23/528; H01L 23/5286; H01L 27/0207; H01L 27/11807; H01L 27/11881; H10D 89/10
See application file for complete search history.

(56) References Cited

U.S. PATENT DOCUMENTS

| 10,141,336 B2 | 11/2018 | Lee | |
|---|---|---|---|
| 2009/0079469 A1* | 3/2009 | Ogata | ................ H03K 19/0013 257/E29.166 |
| 2017/0294448 A1* | 10/2017 | Debacker | .......... H01L 27/11807 |

(Continued)

FOREIGN PATENT DOCUMENTS

| JP | 2018-190760 A | 11/2018 |
|---|---|---|
| JP | 2020-004763 A | 1/2020 |

(Continued)

OTHER PUBLICATIONS

Japanese Office Action dated Nov. 5, 2024 issued in the corresponding Japanese Patent Application No. 2021-006440, with English machine translation.

*Primary Examiner* — Herve-Louis Y Assouman
*Assistant Examiner* — Christopher M Roland
(74) *Attorney, Agent, or Firm* — Rimon P.C.

(57) ABSTRACT

A semiconductor device includes first and second power supply lines formed in a first wiring layer and extending in a first direction; third and fourth power supply lines formed in a second wiring layer, extending in a second direction, and connected to the first and second power supply lines, respectively; a fifth power supply line formed in the first wiring layer; and a first power switch circuit including a transistor provided between the first and fifth power supply lines. The transistor overlaps at least one of the third and fourth power supply lines. The first power switch circuit includes first and second wirings formed in the second wiring layer, extending in the second direction, not overlapping the third and fourth power supply lines, and connected to a source of the transistor and the fifth power supply line, and to a drain and the third power supply line, respectively.

11 Claims, 12 Drawing Sheets

(56) References Cited

U.S. PATENT DOCUMENTS

| | | | |
|---|---|---|---|
| 2018/0315743 A1 | 11/2018 | Takeno et al. | |
| 2019/0081029 A1 | 3/2019 | Okamoto et al. | |
| 2019/0214377 A1 | 7/2019 | Ryu et al. | |
| 2019/0244900 A1 | 8/2019 | Frederick, Jr. et al. | |
| 2019/0312024 A1 | 10/2019 | Takeno et al. | |
| 2019/0393206 A1 | 12/2019 | Wang et al. | |
| 2020/0042668 A1* | 2/2020 | Peng | H01L 23/535 |
| 2020/0303306 A1 | 9/2020 | Shirai | |
| 2020/0411502 A1 | 12/2020 | Wang et al. | |
| 2022/0231681 A1* | 7/2022 | Okamoto | H03K 19/0013 |

FOREIGN PATENT DOCUMENTS

| | | |
|---|---|---|
| JP | 2020-155505 A | 9/2020 |
| WO | 2017/208887 A1 | 12/2017 |

\* cited by examiner

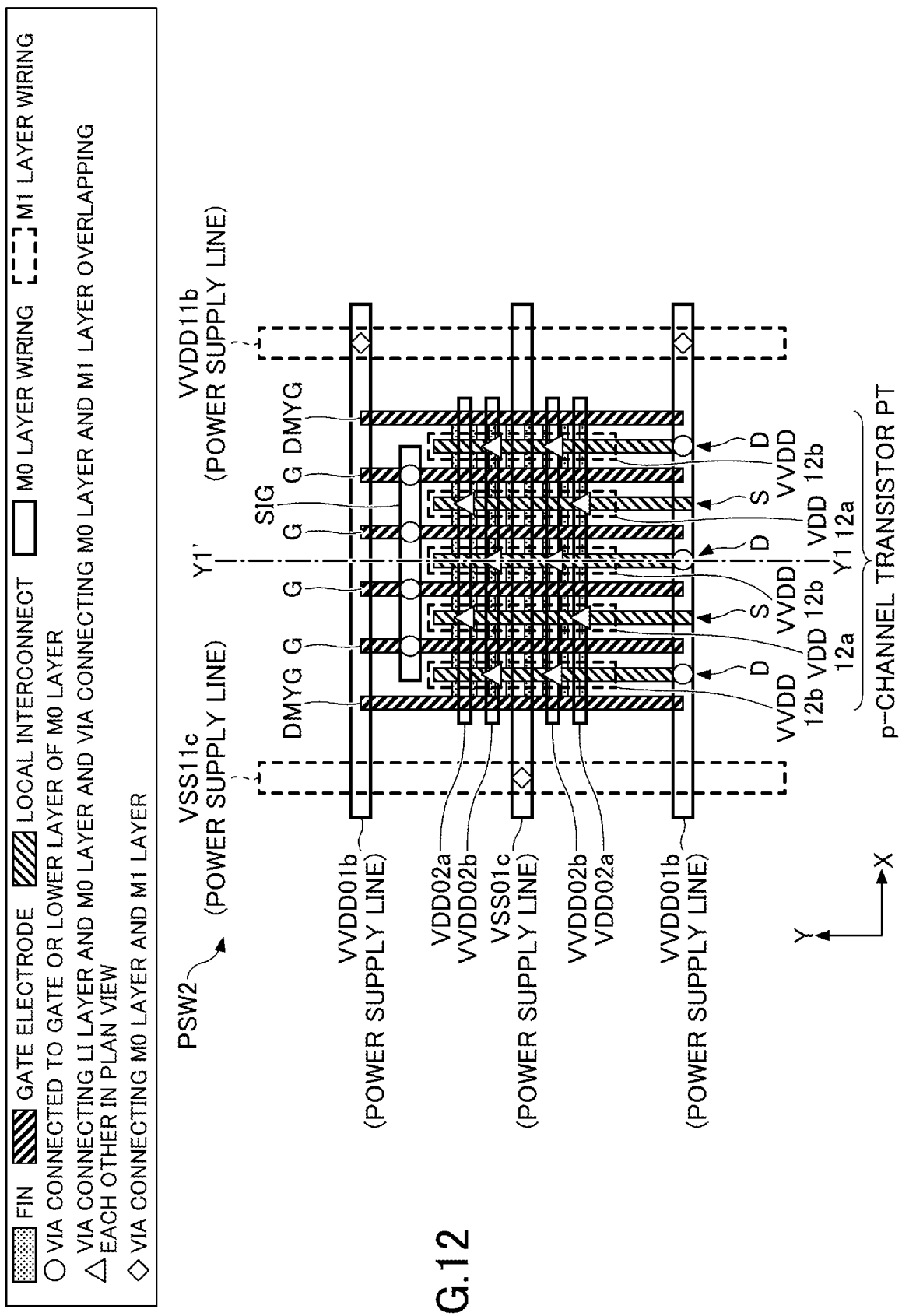

POWER SUPPLY LINE ARRANGEMENT HAVING POWER SWITCH CIRCUIT

CROSS-REFERENCE TO RELATED APPLICATION

The present application claims priority under 35 U.S.C. § 119 to Japanese Patent Application No. 2021-006440, filed Jan. 19, 2021, the contents of which are incorporated herein by reference in their entirety.

BACKGROUND OF THE INVENTION

1. Field of the Invention

The disclosures herein generally relate to semiconductor devices.

2. Description of the Related Art

Conventionally, power switch circuits have been known for reducing leakage currents of semiconductor devices. The power switch circuit is arranged between a power supply line and a virtual power supply line that is a power supply line of each of a plurality of circuit blocks, and is turned ON when the circuit block operates. For example, a size of a transistor used in the power switch circuit is designed to be larger than that of a cell transistor used in a logic circuit in the circuit block in order to enhance a power supply capability of the power switch circuit (See, for example, U.S. patent Ser. No. 10/141,336, US Patent Application Publication No. 2019/0244900, US Patent Application Publication No. 2019/0214377, Japanese Unexamined Patent Application Publication No. 2018-190760, and WO 2017/208887).

SUMMARY OF INVENTION

Problem to be Solved by the Invention

When a layout size of the power switch circuit becomes large due to the large size of the transistors, the power switch circuit is not fit between the power supply wiring disposed at a predetermined pitch. In this case, the power switch circuit is positioned across the power supply wiring that is positioned at a predetermined pitch. Also, to provide sufficient power supply voltage to circuit blocks operating using virtual power supply voltages, virtual power supply lines wired between the power switch circuits and the circuit blocks are preferably formed using metal wiring layers close to a semiconductor substrate.

However, when a virtual power supply line wired between the power switch circuit and the circuit block is formed using the metal wiring layer close to the semiconductor substrate, a wiring formed using the metal wiring layer close to the semiconductor substrate in the power switch circuit may compete with the virtual power supply line.

The present invention has been made in view of the above-described problem, and aims at providing a semiconductor device in which when a power supply line, such as a virtual power supply line, is formed using a metal wiring layer close to a semiconductor substrate, competition of the power supply line with a wiring in a power switch circuit that is disposed in the same layer as the power supply line is avoided.

Means for Solving the Problem

According to an aspect of the present invention, a semiconductor device includes a first power supply line formed in in a first wiring layer and extending in a first direction in a plan view; a second power supply line formed in the first wiring layer and extending in the first direction; a third power supply line formed in a second wiring layer disposed on the first wiring layer, extending in a second direction different from the first direction in the plan view, and connected to the first power supply line; a fourth power supply line formed in the second wiring layer, extending in the second direction, and connected to the second power supply line; a fifth power supply line formed in the first wiring layer; and a first power switch circuit including a transistor provided between the first power supply line and the fifth power supply line, the transistor being positioned in the plan view overlapping at least one of the third power supply line and the fourth power supply line, and the first power switch circuit including a first wiring that is formed in the second wiring layer, is electrically connected to a source region of the transistor and to the fifth power supply line, extends in the second direction, and overlaps neither the third power supply line nor the fourth power supply line in the plan view above the transistor, and a second wiring that is formed in the second wiring layer, is electrically connected to a drain region of the transistor and to the third power supply line, extends in the second direction, and overlaps neither the third power supply line nor the fourth power supply line in the plan view above the transistor.

Effect of the Invention

According to the disclosure of the present application, when a first power supply line is formed using a metal wiring layer close to a semiconductor substrate, competition between the first power supply line and a wiring in a power switch circuit can be avoided.

BRIEF DESCRIPTION OF DRAWINGS

Other objects and further features of the present invention will be apparent from the following detailed description when read in conjunction with the accompanying drawings, in which:

FIG. 12 is a diagram illustrating an example of a layout of a power supply wiring of the power switch circuit PSW2 illustrated in FIG. 11.

DESCRIPTION OF THE PREFERRED EMBODIMENTS

In the following, embodiments will be described with reference to the drawings.

First Embodiment

Figure 1:
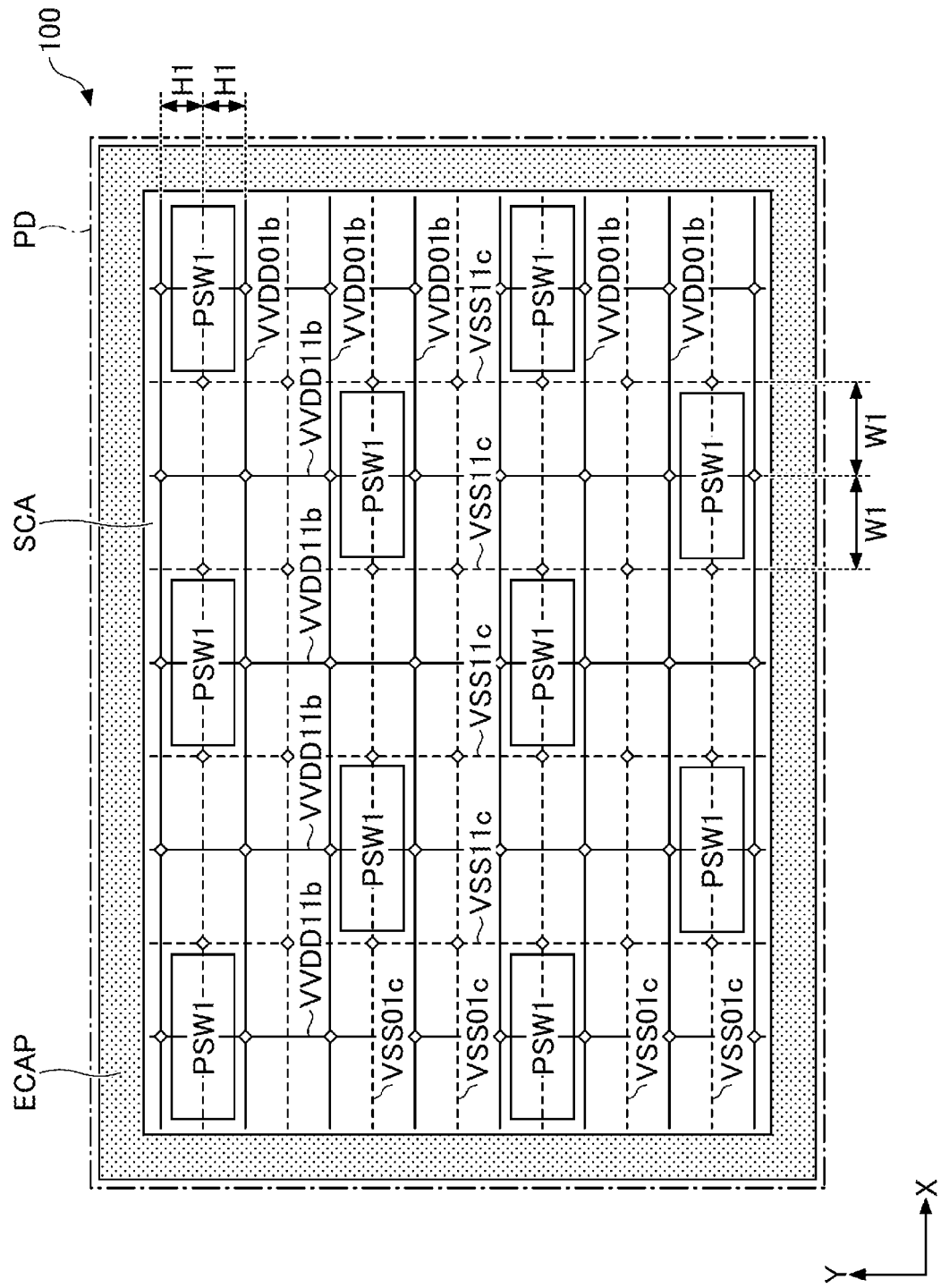
FIG. 1 is a diagram illustrating an example of a layout of a semiconductor device according to a first embodiment.

FIG. 1 illustrates an example of a layout of a semiconductor device according to a first embodiment. The semiconductor device 100 illustrated in FIG. 1 has, for example, at least one power domain PD. Within the power domain PD, a standard cell area SCA is provided in which a plurality of standard cells (not shown) are arranged. The transistor mounted on the semiconductor device 100 is, without limitation, a fin field-effect transistor (finFET). The finFET will be described with reference to FIG. 5. The standard cell area SCA is an example of a first region in which a logic circuit can be disposed.

An endcap ECAP shown by a shaded pattern is arranged around the standard cell area SCA. The endcap ECAP has a dummy gate electrode or a dummy transistor, which are not shown. In the standard cell area SCA, a virtual power supply line VVDD01$b$ and a ground line VSS01$c$ extending in the X-direction, in the horizontal direction of FIG. 1, are alternately disposed in the vertical direction of FIG. 1, in the Y-direction, at an interval H1. The X-direction is an example of a first direction, and the Y-direction is an example of a second direction intersecting the X-direction.

Furthermore, in the standard cell area SCA, the virtual power supply line VVDD11$b$ and the ground line VSS11$c$ extending in the Y-direction are alternately disposed in the X-direction at an interval W1. In FIG. 1, the virtual power supply lines VVDD01$b$ and 11$b$ are shown by solid lines, and the ground lines VSS01$c$ and 11$c$ are shown by dashed lines.

For example, the virtual power supply line VVDD01$b$ and the ground line VSS01$c$ extending in the X-direction are formed using an M0 layer that is the metal wiring layer closest to the semiconductor substrate. The virtual power supply line VVDD11$b$ and the ground line VSS11$c$ extending in the Y-direction are formed using an M1 layer, which is a metal wiring layer provided directly above the M0 layer. The M0 layer is an example of a first wiring layer, and the M1 layer is an example of a second wiring layer. The virtual power supply line VVDD01$b$ is an example of a first power supply line, and the ground line VSS01$c$ is an example of a second power supply line. The virtual power supply line VVDD11$b$ is an example of a third power supply line, and the ground line VSS11$c$ is an example of a fourth power supply line.

When a power supply line VDD is described without distinguishing a wiring layer or the like, such a power supply line will be simply referred to as a power supply line VDD or a wiring VDD. When a virtual power supply line VVDD is described without distinguishing a wiring layer or the like, such a virtual power supply line will be simply referred to as a virtual power supply line VVDD or a wiring VVDD. When describing a ground line VSS without distinguishing a wiring layer or the like, such a ground line will be simply referred to as a ground line VSS or a power supply line VSS.

The virtual power supply line VVDD01$b$ extending in the X-direction and the virtual power supply line VVDD11$b$ extending in the Y-direction are connected to each other through a via at the intersection. Similarly, the ground line VSS01$c$ extending in the X-direction and the ground line VSS11$c$ extending in the Y-direction are connected to each other through a via at the intersection. In the standard cell area SCA, a mesh-shaped virtual power supply line VVDD and a mesh-shaped ground line VSS are provided. The power supply line VDD (not shown) that supplies power to the virtual power supply line VVDD is provided using a plurality of wiring layers on or above the M1 layer. The power supply line VDD is an example of a third power supply line.

In the standard cell area SCA, a plurality of power switch circuits PSW1 are provided at intervals. For example, each power switch circuit PSW1 is designed to have a layout size so as to be positioned in an area surrounded by two virtual power supply lines VVDD01$b$ extending in the X-direction and two ground lines VSS11$c$ extending in the Y-direction.

In other words, each power switch circuit PSW1 is a double-height cell (two-height cells) disposed between the two virtual power supply lines VVDD01$b$ extending in the X-direction and across one ground line VSS01$c$ positioned between the two virtual power supply lines VVDD01$b$ extending in the X-direction. Each power switch circuit PSW1 is disposed, for example, between the two ground lines VSS11$c$ extending in the Y-direction and across one virtual power supply line VVDD11$b$ positioned between the two ground lines VSS11$c$ extending in the Y-direction. In addition, a standard cell is not disposed in the area where the power switch circuit PSW1 is disposed.

By designing the power switch circuit PSW1 to have a size larger than the interval H1 and the interval W1, the supply capability of a power supply voltage VVDD to the standard cell by the power switch circuit PSW1 can be enhanced. However, when the size of the power switch circuit PSW1 in the X-direction is designed to be larger than the interval W1, the power switch circuit PSW1 overlaps the virtual power supply line VVDD11$b$ or the ground line VSS11$c$ of the M1 layer extending in the Y-direction in a plan view. Similarly, when the size of the power switch circuit PSW1 in the Y-direction is designed to be larger than the interval H1, the power switch circuit PSW1 overlaps the ground line VSS01$c$ or the virtual power supply line VVDD01$b$ of the M0 layer extending in the X-direction in a plan view.

Figure 3:
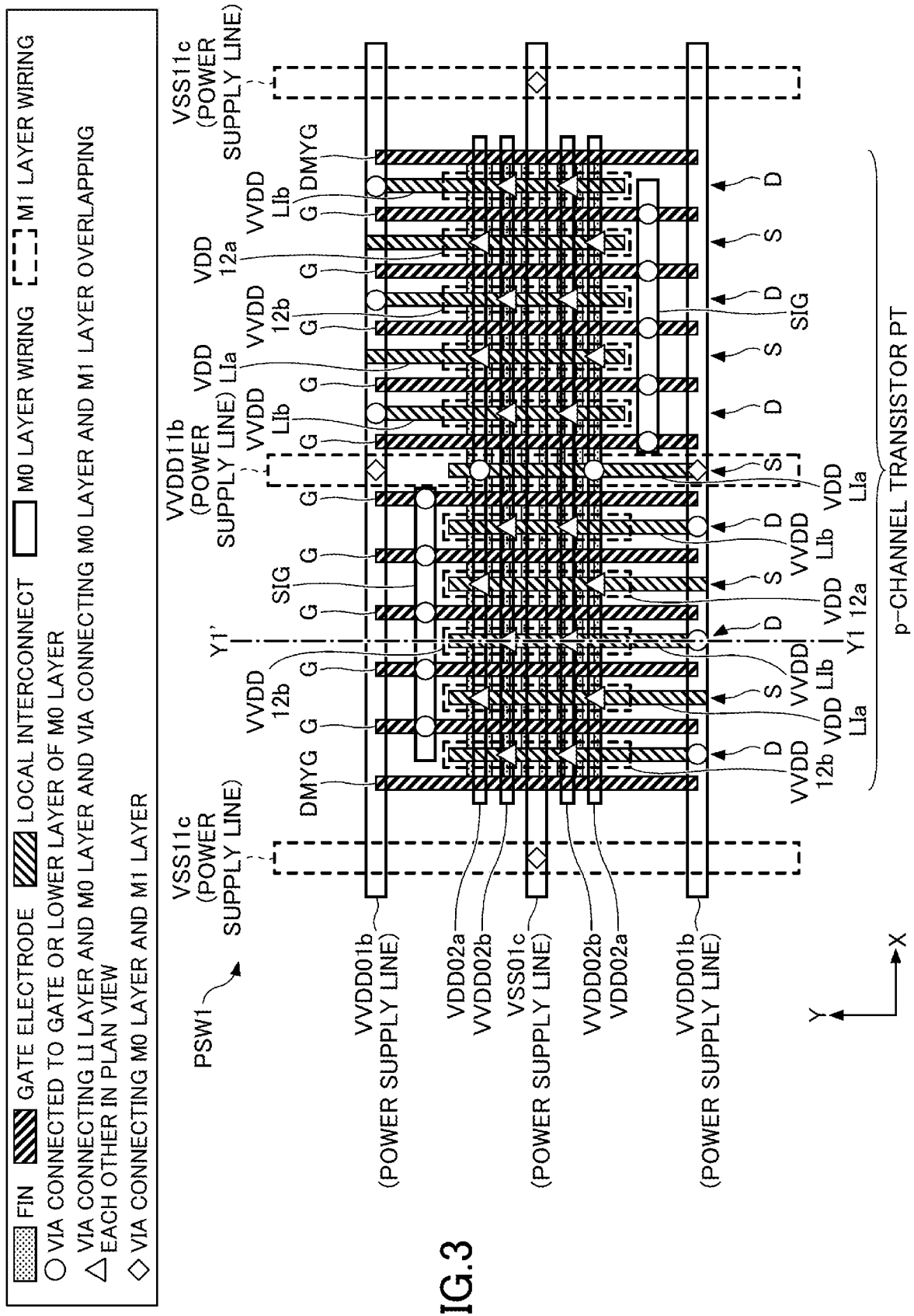
FIG. 3 is a diagram illustrating an example of a layout of a power supply wiring of the power switch circuit illustrated in FIG. 2.

As illustrated in FIG. 3, an internal wiring of the power switch circuit PSW1 is formed using the M1 layer as well as the M0 layer. Therefore, it is necessary to devise the layout so that the internal wiring of the M1 layer in the power switch circuit PSW1 does not compete with the power supply wiring VVDD11$b$ of the M1 layer. In particular, when the wiring of the M1 layer in the power switch circuit PSW1 is connected to the source and drain electrodes which are alternately disposed with the gate electrode in between in the transistor, it is necessary to form the wiring of the M1 layer avoiding competition with the power supply wiring VVDD11$b$ of the M1 layer. Details of the devising of the layout will be described with reference to FIGS. 3 and 4.

As illustrated in FIG. 1, the power switch circuits PSW1 are arranged in the X-direction at a pitch twice the wiring pitch of the virtual power supply lines VVDD01$b$ (or the ground lines VSS01$c$) aligned in the X-direction. Furthermore, the power switch circuits PSW1 are arranged in the Y-direction at a pitch of four times the wiring pitch of the virtual power supply lines VVDD11b (or the ground lines VSS11c) aligned in the Y-direction.

That is, the transistors of the plurality of power switch circuits PSW1 arranged in the standard cell area SCA (e.g., p-channel transistors PT illustrated in FIG. 3) overlap at least one of the virtual power supply line VVDD11b and the ground line VSS01c at the same relative positions in a plan view. The power switch circuits PSW1 may be arranged at a pitch that is an integer multiple of the wiring pitch of the virtual power supply lines VVDD (or the ground lines VSS) in each of the X and Y-directions, such as three times or six times the wiring pitch.

By setting the arrangement pitch to a pitch that is an integer multiple of the wiring pitch, for all the power switch circuits PSW1, the positional relationship of the virtual power supply lines VVDD01b and 11b and the ground lines VSS01c and 11c with respect to the power switch circuit PSW1 can be made the same. As a result, the layout data of the power switch circuit PSW1 arranged across at least any one of the virtual power supply lines VVDD01b and 11b and the ground lines VSS01c and 11c can be made common, and the layout design of the power switch circuit PSW1 can be facilitated.

Furthermore, the size of the power switch circuit PSW1 in the X-direction is not limited to twice the interval W1. Similarly, the size of the power switch circuit PSW1 in the Y-direction is not limited to twice the interval H1. In FIG. 1, the power switch circuit PSW1 is arranged in a staggered pattern, but the pattern of the arrangement is not limited to that illustrated in FIG. 1.

Figure 2:
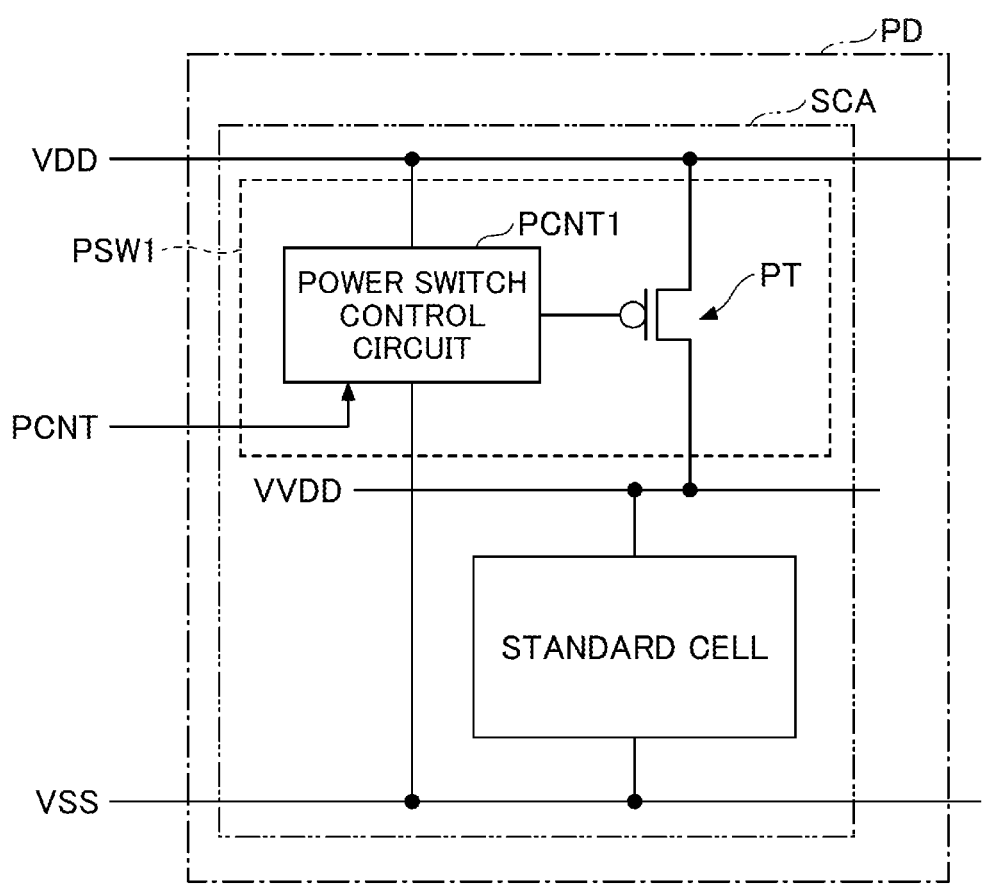
FIG. 2 is a block diagram depicting an example of a power switch circuit illustrated in FIG. 1.

FIG. 2 is a diagram depicting an example of the power switch circuit PSW1 illustrated in FIG. 1. Power switch circuit PSW1 has a p-channel transistor PT and a power switch control circuit PCNT1. The p-channel transistor PT actually includes a plurality of transistors connected in parallel.

A source of the p-channel transistor PT is connected, for example, to a power supply line VDD to which an external power VDD is supplied, and a drain of the p-channel transistor is connected to the virtual power supply line VVDD of the standard cell. A gate electrode of the p-channel transistor PT is connected to the output of the power switch control circuit PCNT1. The power switch circuit PSW1 may have an n-channel transistor instead of the p-channel transistor PT. In this case, a source of the n-channel transistor is connected to the ground line VSS, and a drain is connected to each logic circuit of the standard cell and to a virtual ground line which supplies a ground voltage.

The power switch control circuit PCNT1 is connected to the power supply line VDD and the ground line VSS for a constant operation, and operates based on the power control signal PCNT. The power switch control circuit PCNT1 provides a ground voltage VSS to the gate electrode of the p-channel transistor PT, when the power control signal PCNT indicates an active mode for operating a circuit in the power domain PD. Thus, the p-channel transistor PT is turned ON, and the power supply line VDD and the virtual power supply line VDDD are connected to each other.

The power switch control circuit PCNT1 supplies the power supply voltage VDD to the gate electrode of the p-channel transistor PT when the power control signal PCNT indicates a power down mode. Thus, the p-channel transistor PT is turned OFF, and the connection between the power supply line VDD and the virtual power supply line VVDD is cut. In this manner, the p-channel transistor PT operates based on the power control signal PCNT, and functions as a power switch connecting the power supply line VDD to the virtual power supply line VVDD.

The p-channel transistor PT is turned ON during the active mode, to connect the power supply line VDD to the virtual power supply line VVDD. Thus, the standard cell in the power domain PD operates supplied with the power supply voltage VDD via the virtual power supply line VVDD during the active mode. On the other hand, the p-channel transistor PT is turned OFF during the power down mode, and the power supply line VDD is disconnected from the virtual power supply line VVDD. Thus, the supply of the power supply voltage VDD to the standard cell in the power domain PD stops, and the operation stops during the power down mode.

FIG. 3 is a diagram depicting an example of the layout of the power supply wiring of the power switch circuit PSW1 illustrated in FIG. 2. In FIG. 3, the power switch control circuit PCNT1 of FIG. 2 is not shown.

Hereinafter, the virtual power supply lines VVDD01b and VVDD11b, and the ground lines VSS01c and VSS11c, which are wired from the outside of the power switch circuit PSW1, are also referred to as power supply lines VVDD and VSS. The virtual power supply lines VVDD02b and VVDD12b, and power supply lines VDD02a and VDD12a, enclosed within the power switch circuit PSW1 are also referred to as wirings VVDD02b, VVDD12b, VDD02a, and VDD12a, respectively. As described in FIG. 1, two power supply lines VVDD01b and one power supply line VSS01c extending in the X-direction are formed using the M0 layer. Two power supply lines VSS11c and one power supply line VVDD11b extending in the Y-direction are formed using the M1 layer.

The power switch circuit PSW1 has a plurality of p-channel transistors PT having a plurality of fins extending in the X-direction and a plurality of gate electrodes G extending in the Y-direction. The plurality of fins are arranged at intervals in the Y-direction. The plurality of gate electrodes G are arranged at intervals in the X-direction. Dummy gate electrodes DMYG are disposed on both sides of an area, in which the plurality of gate electrodes G are arranged, in the X-direction.

Each gate electrode G is a gate electrode of the p-channel transistor PT illustrated in FIG. 2, and is connected through a via to a signal line SIG formed in the M0 layer. The signal line SIG is connected to the output of the power switch control circuit PCNT1 illustrated in FIG. 2 through wirings, vias, or the like (not shown).

In the p-channel transistor PT, a source region S or a drain region D is formed between two adjacent gate electrodes G. The source region S and the drain region D are alternately formed with the gate electrodes G in between. Each source region S is electrically connected to a local interconnect VDDLIa extending in the Y-direction on each source region S in a local interconnect (LI) layer. Each drain region D is electrically connected to a local interconnect VVDDLIb extending in the Y-direction on each drain region D in the LI layer. The LI layer is a wiring layer provided between the semiconductor substrate and the M0 layer.

In the finFET, each of the source region S and the drain region D is formed in a fin. For this reason, the local interconnect VDDLIa is connected to a fin that functions as the source region S, and the local interconnect VVDDLIb is connected to a fin that functions as the drain region D.

The local interconnect VDDLIa extending in the Y-direction in the LI layer is connected through a via to the wiring VDD02a of the M0 layer extending in the X-direction on the p-channel transistor PT, and through a via to the wiring VDD12*a* of the M1 layer extending in the Y-direction on the source region S. The wiring VDD12*a* of the M1 layer extending in the Y-direction on the source region S is an example of the first wiring. Triangular symbols in the drawings represent both vias provided between the LI layer and the M0 layer and vias provided between the M0 layer and the M1 layer, that overlap each other in a plan view.

By arranging the wiring VDD12*a* of the M1 layer on the local interconnect VDDLI*a* of each source region S and connecting the wiring VDD12*a* and the wiring VDDLI*a* to each other, a resistance value of the source region S extending in the Y-direction can be reduced and the supply of the power supply voltage VDD can be increased. In addition, by connecting the local interconnects VDDLI*a* to each other through the wiring VDD02*a* of the M0 layer, a sufficient power supply voltage VDD can be efficiently supplied to each source region S.

The wiring VDD02*a* of the M0 layer, the wiring VDD12*a* of the M1 layer, or both are connected through vias to a mesh-shaped power supply line VDD formed in a wiring layer above the M1 layer. For example, vias connecting the wiring VDD02*a* or the wiring VDD12*a* to the power supply line VDD may be formed at the same position in a plan view as the vias represented by the triangular symbols on the source region S. Alternatively, the vias connecting the wiring VDD02*a* to the power supply line VDD may be formed with the wiring VDD12*a* of the M1 layer at the position where the wiring VDD02*a* of the M0 layer is extended further in the X-direction with respect to FIG. 3, or at the position where the wiring VDD12*a* of the M1 layer is extended further in the Y-direction with respect to FIG. 3.

The local interconnect VVDDLI*b* extending in the Y-direction in the LI layer is connected through a via to the wiring VVDD02*b* of the M0 layer extending in the X-direction on the p-channel transistor PT, and further through a via to the wiring VVDD12*b* of the M1 layer extending in the Y-direction on the drain region D. The wiring VVDD12*b* of the M1 layer extending in the Y-direction on the drain region D is an example of a second wiring.

By arranging the wiring VVDD12*b* of the M1 layer on the local interconnect VVDDLI*b* of each drain region D and connecting the wiring VVDD12*b* and the wiring VVDDLI*b* to each other, a resistance value of the drain region D extending in the Y-direction can be reduced and the supply of the power supply voltage VVDD can be increased. In addition, by connecting the local interconnects VVDDLI*b* to each other through the wiring VVDD02*b* of the M0 layer, a sufficient power supply voltage VVDD can be efficiently output from each drain region D.

In FIG. 3, the power supply line VVDD11*b* of the M1 layer is formed in the p-channel transistor PT, e.g., on the source region S located at the center in the X-direction. The power supply line VVDD11*b* of the M1 layer supplies the power supply voltage VVDD to the standard cell, supplied from each drain region D of the p-channel transistor PT through the local interconnect VVDDLI*b* and the power supply line VVDD02*b* of the M0 layer. The power supply line VVDD11*b* of the M1 layer may be disposed at a location other than on the source region S.

By arranging the power supply line VVDD11*b* of the M1 layer at a center in the X-direction of the p-channel transistor PT, variations in distances between six drain regions D and the power supply line VVDD11*b* of the M1 layer of the M1 layer can be suppressed. Thus, variations in parasitic resistances between the drain regions D and the power supply line VVDD11*b* of the M1 layer are suppressed, and the power supply voltage VVDD can be supplied efficiently to the standard cell. The number of the power supply lines VVDD11*b* of the M1 layer is not limited to one. A group of the plurality of power supply lines VVDD11*b* may be arranged. In this case, the group of the plurality of power supply lines VVDD11*b* of the M1 layer may be located at the center in the X-direction of the p-channel transistor PT.

On the other hand, in order to avoid competition with the power supply line VVDD11*b* of the M1 layer, the wiring VDD12*a* of the M1 layer is not formed on the source region S facing the power supply line VVDD11*b* of the M1 layer. However, the local interconnect VDDLI*a* on the source region S facing the power supply line VVDD11*b* of the M1 layer is sequentially connected to the wiring VDD02*a* of the M0 layer extending in the X-direction through a via and the power supply line VDD12*a* of the M1 layer, and is further connected to a power supply line VDD in a layer above the M1 layer.

Therefore, even when the size of the power switch circuit PSW1 is large and the power supply line VVDD11*b* of the M1 layer is wired across the power switch circuit PSW1, the desired power supply voltage VDD can be supplied to the source region S located below the power supply line VVDD12*b* of the M1 layer. In other words, sufficient power supply voltage VVDDs can be supplied from the power switch circuit PSW1 to the standard cell without degrading supply capability with the power supply voltage VDD to the power switch circuit PSW1.

Figure 4:
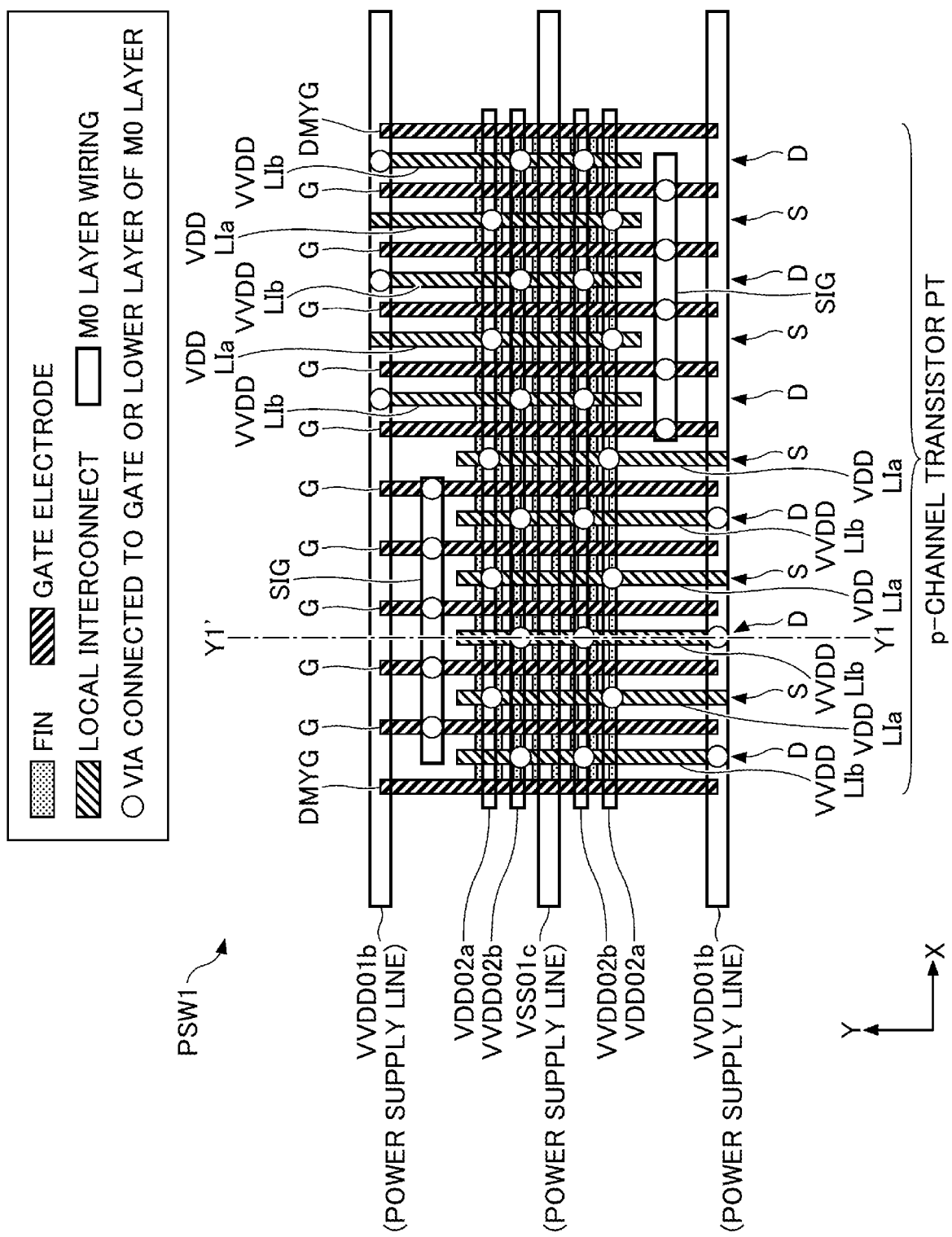
FIG. 4 is a diagram depicting the layout illustrated in FIG. 3 excluding the wiring of the M1 layer and vias between the M0 layer and the M1 layer.

FIG. 4 illustrates a layout obtained by excluding the wiring of the M1 layer and the vias between the M0 and M1 layers from the layout of FIG. 3. The local interconnect VDDLI*a* in the LI layer electrically connected to each source region S is connected through vias to the two wirings VDD02*a* of the M0 layer extending in the X-direction. The local interconnect VVDDLI*b* in the LI layer electrically connected to each drain region D is connected through vias to the two wirings VVDD02*b* of the M0 layer extending in the X-direction. Thus, even when the power supply line VVDD11*b* of the M1 layer (FIG. 3) is wired on the power switch circuit PSW1 in the Y-direction, the repeating structure and the repeating interval of the source region S, the gate electrode G, and the drain region D can be maintained to form the p-channel transistor PT.

Figure 5:
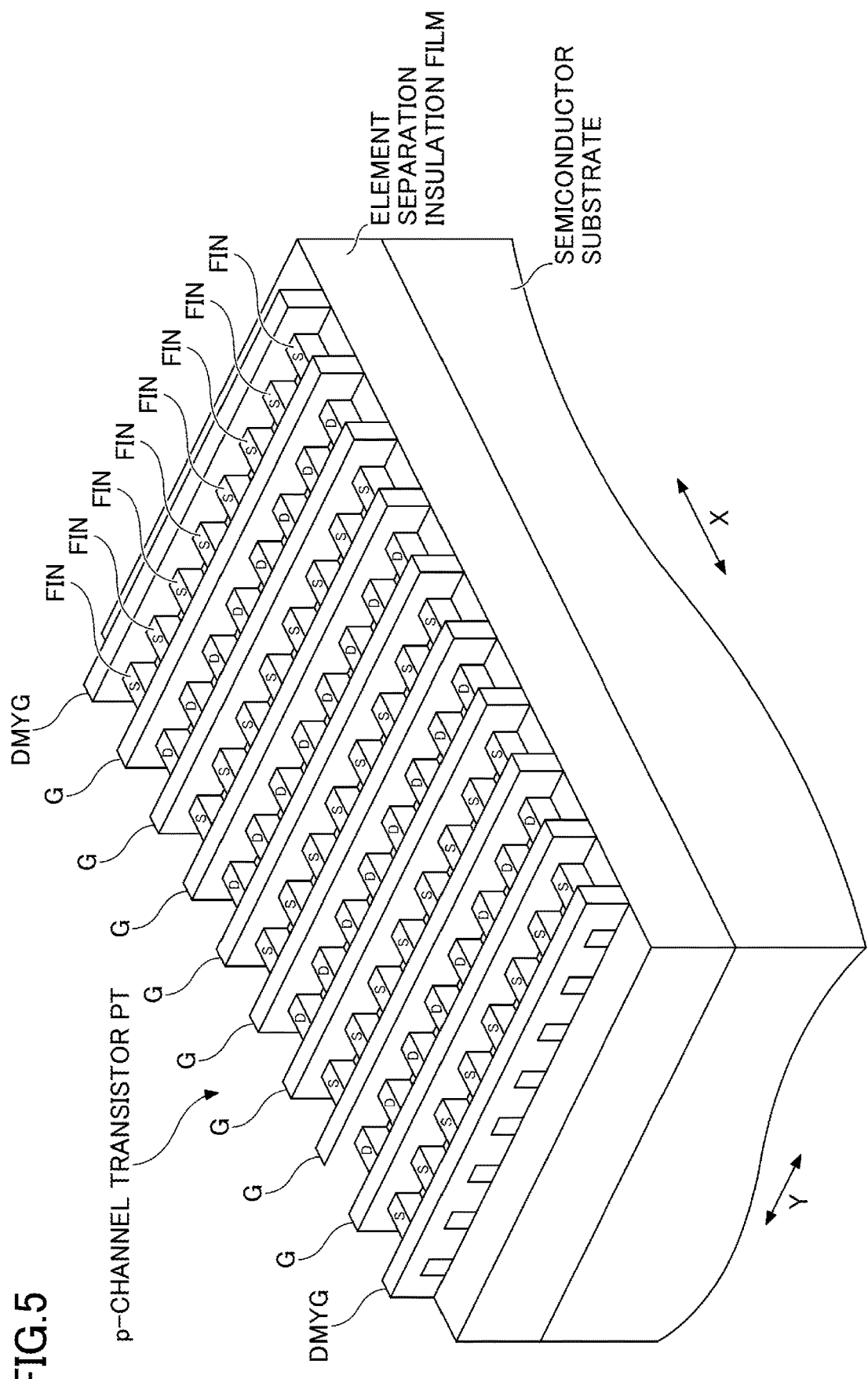
FIG. 5 is a perspective view depicting an example of a structure of the p-channel transistor illustrated in FIGS. 3 and 4.

FIG. 5 illustrates an example of the structure of the p-channel transistor PT illustrated in FIGS. 3 and 4. The p-channel transistor PT has an X-direction extending fin on a semiconductor substrate and a Y-direction extending gate electrode G across the fin. In the example of FIG. 5, the p-channel transistor PT has eight fins and ten gate electrodes G. A gate insulation film is formed between the fin and the gate electrode G, and a channel of the p-channel transistor PT is formed on the surface portion of the fin covered with the gate insulation film. The number of fins may be other than 8 and the number of gate electrodes G may be other than 10.

The source region S and the drain region D are provided on both sides of the gate electrode G in the fin. Although not shown, each source region and each drain region D is provided with a local interconnect VDD and a local interconnect VVDD in the extending direction of the gate electrode G, respectively. In FIG. 5, the source region S and the drain region D may be exchanged.

Figure 6:
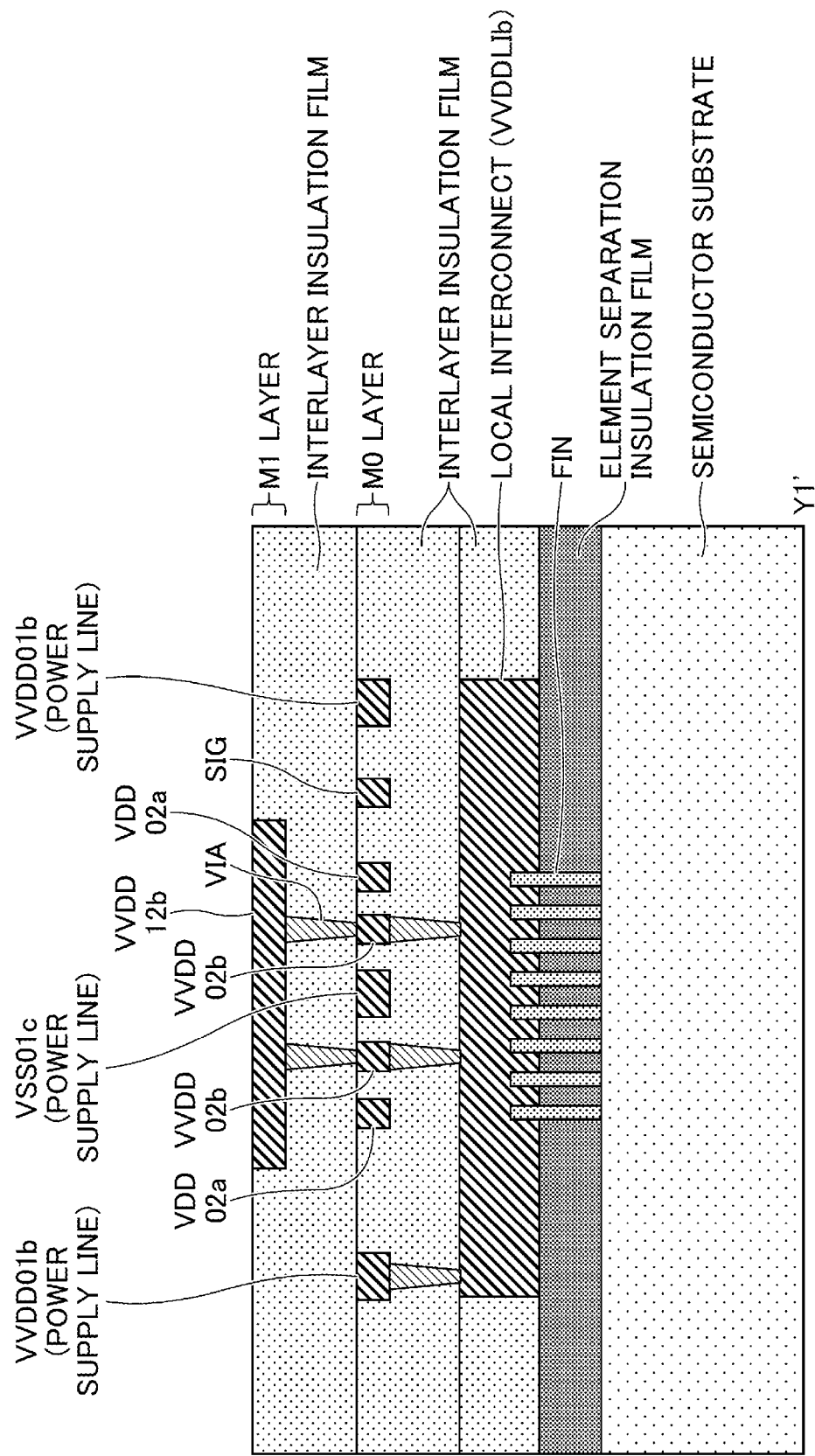
FIG. 6 is a cross-sectional view cut along a line Y1-Y1' in FIG. 3.

FIG. 6 illustrates a cross-section cut along the line Y1-Y1' in FIG. 3. The fins are formed in an element separation insulation film, such as a shallow trench isolation (STI) formed on a semiconductor substrate. The top of the fins protruding onto the element separation insulation film is covered with a local interconnect VVDDLI*b* in the cross-section illustrated in FIG. 6. In the cross-section illustrated in FIG. 6, the local interconnect VVDDLIb is connected through vias to two power supply lines VVDD01b and wiring VVDD02b formed in the M0 layer.

In the cross-section illustrated in FIG. 6, the wiring VVDD02b of the M0 layer is connected through vias to the wiring VVDD12b formed in the M1 layer. Each local interconnect VVDDLIb is formed in an interlayer insulation film. The interlayer insulation film on the local interconnect VVDDLIb is formed with the vias, the power supply line VVDD01b of the M0 layer, the wirings VDD02a and VVDD02b, the power supply line VSS01c, and the signal line SIG. The power supply line VVDD12b of the M1 layer is formed in the interlayer insulation film on the M0 layer.

As described above, in this embodiment, even when the power switch circuit PSW1 is large and the power supply line VVDD11b of the M1 layer is wired across the power switch circuit PSW1, the desired power supply voltage VDD can be supplied to the source region S located below the power supply line VVDD11b of the M1 layer. In other words, a sufficient power supply voltage VVDD can be supplied from the power switch circuit PSW1 to the standard cell without degrading the supply capability of the power supply voltage VDD to the power switch circuit PSW1.

Also, when the power supply line VVDD11b of the M1 layer is wired in the Y-direction of the power switch circuit PSW1, the p-channel transistor PT can be formed while retaining the repeating structure and the repeating spacing of the source region S, the gate electrode G, and the drain region D. In this case, for example, by placing the power supply line VVDD11b of the M1 layer in the center of the X-direction of the p-channel transistor PT, the difference among distances between the six drain regions D and the power supply line VVDD11b of the M1 layer can be reduced. This reduces a variation in parasitic resistance between the drain regions D and the power supply line VVDD11b of the M1 layer, and enables efficient supply of the power supply voltage VVDD to the standard cell.

A positional pitch of the power switch circuit PSW1 is designed to be an integer multiple of the wiring pitch of the power supply line VSS01c or the power supply line VSS11c or the wiring pitch of the virtual power supply line VVDD01b or VVDD11b. Thus, for all the power switch circuits PSW1, the positional relationship of the virtual power supply lines VVDD01b and VVDD11b and the power supply lines VSS01c and VSS11c with respect to the power switch circuit PSW1 can be set to be the same. As a result, layout data of the power switch circuit PSW1 across at least one of the virtual power supply lines VVDD01b and VVDD11b and the power supply lines VSS01c and VSS11c can be made common, and the layout design of the power switch circuit PSW1 can be facilitated.

Second Embodiment

Figure 7:
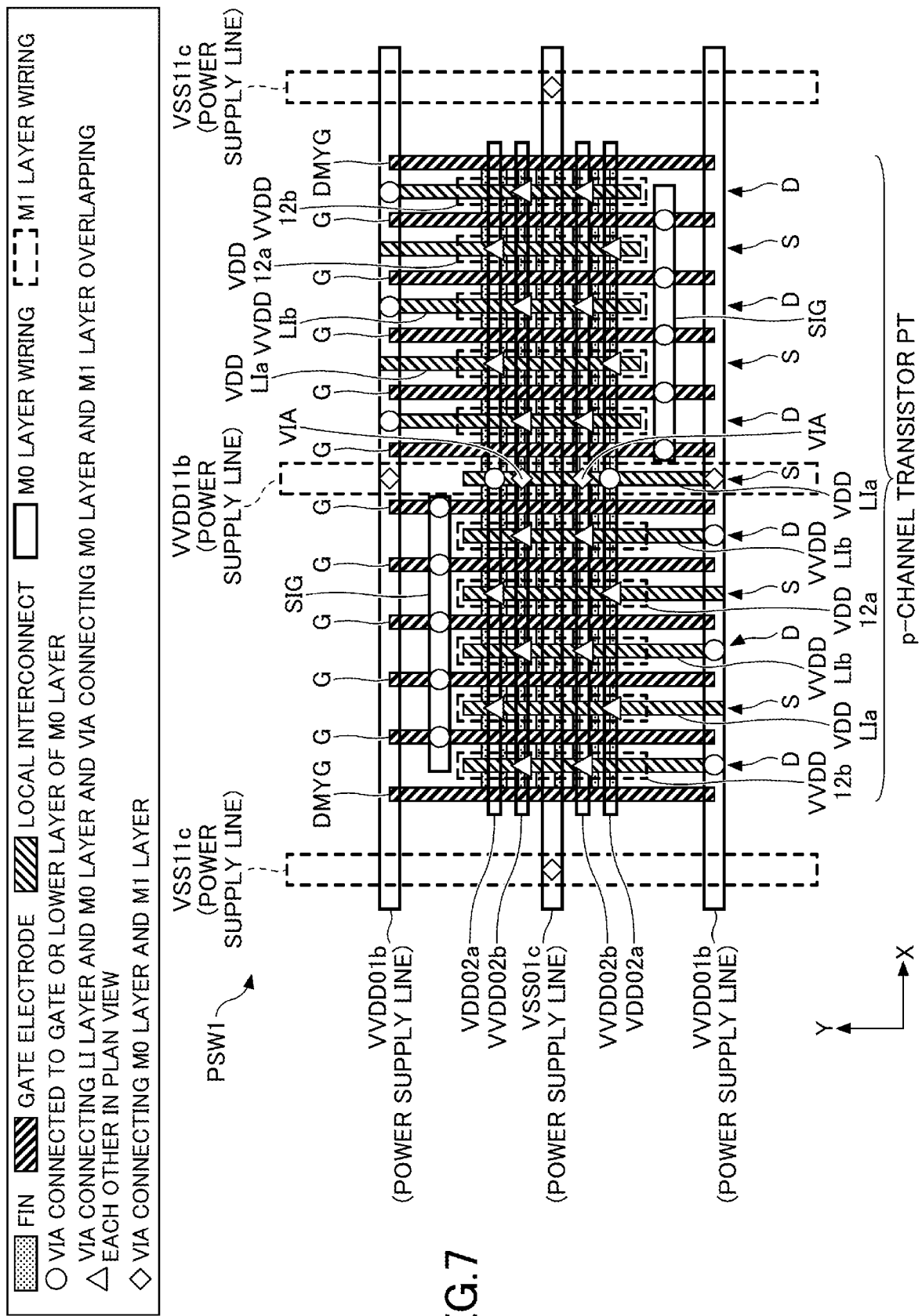
FIG. 7 is a diagram depicting an example of a layout of a power supply wiring of a power switch circuit of a semiconductor device according to a second embodiment.

FIG. 7 is a diagram illustrating an example of a layout of a power switch circuit of a semiconductor device according to a second embodiment. For an element similar to that in FIG. 3, the same reference numeral is assigned, and a detailed description will be omitted. A layout of the semiconductor device having the power switch circuit PSW1 illustrated in FIG. 7 is similar to the layout of the semiconductor device 100 illustrated in FIG. 1. That is, the semiconductor device having the power switch circuit PSW1 illustrated in FIG. 7 has a standard cell area SCA in which a plurality of standard cells are disposed in a power domain PD, and the power switch circuit PSW1 is disposed in the standard cell area SCA.

In this embodiment, the power supply line VVDD11b of the M1 layer disposed in the Y-direction in the central portion in the X-direction of the power switch circuit PSW1 is connected to the wiring VVDD02b of the M0 layer extending in the X-direction through diamond shaped vias. Thus, the power supply voltage VVDD output from the drain region D of the p-channel transistor PT is supplied to the power supply line VVDD11b of the M1 layer through the wiring VVDD02b of the M0 layer extending in the X-direction as well as the power supply line VVDD02b of the M0 layer extending in the X-direction. As a result, the supply capability of the power supply voltage VVDD to the standard cell can be enhanced compared to the power switch circuit PSW1 in FIG. 3. Incidentally, the layout in which the wiring of the M1 layer and the via between the M0 and M1 layers are excluded from the layout in FIG. 7 is the same as that in FIG. 4.

As described above, also in the second embodiment, the same effect as that in the above-described embodiment can be obtained. For example, even when the power supply line VVDD11b of the M1 layer is wired across the power switch circuit PSW1, it is possible to output a sufficient power supply voltage VVDD from the power switch circuit PSW1 without degrading the supply capability of the power supply voltage VDD to the power switch circuit PSW1. In this embodiment, the power supply line VVDD11b of the M1 layer is connected through a via to the wiring VVDD02b of the M0 layer, and thereby the supply capability of the power supply voltage VVDD to the standard cell can be further enhanced.

Third Embodiment

Figure 8:
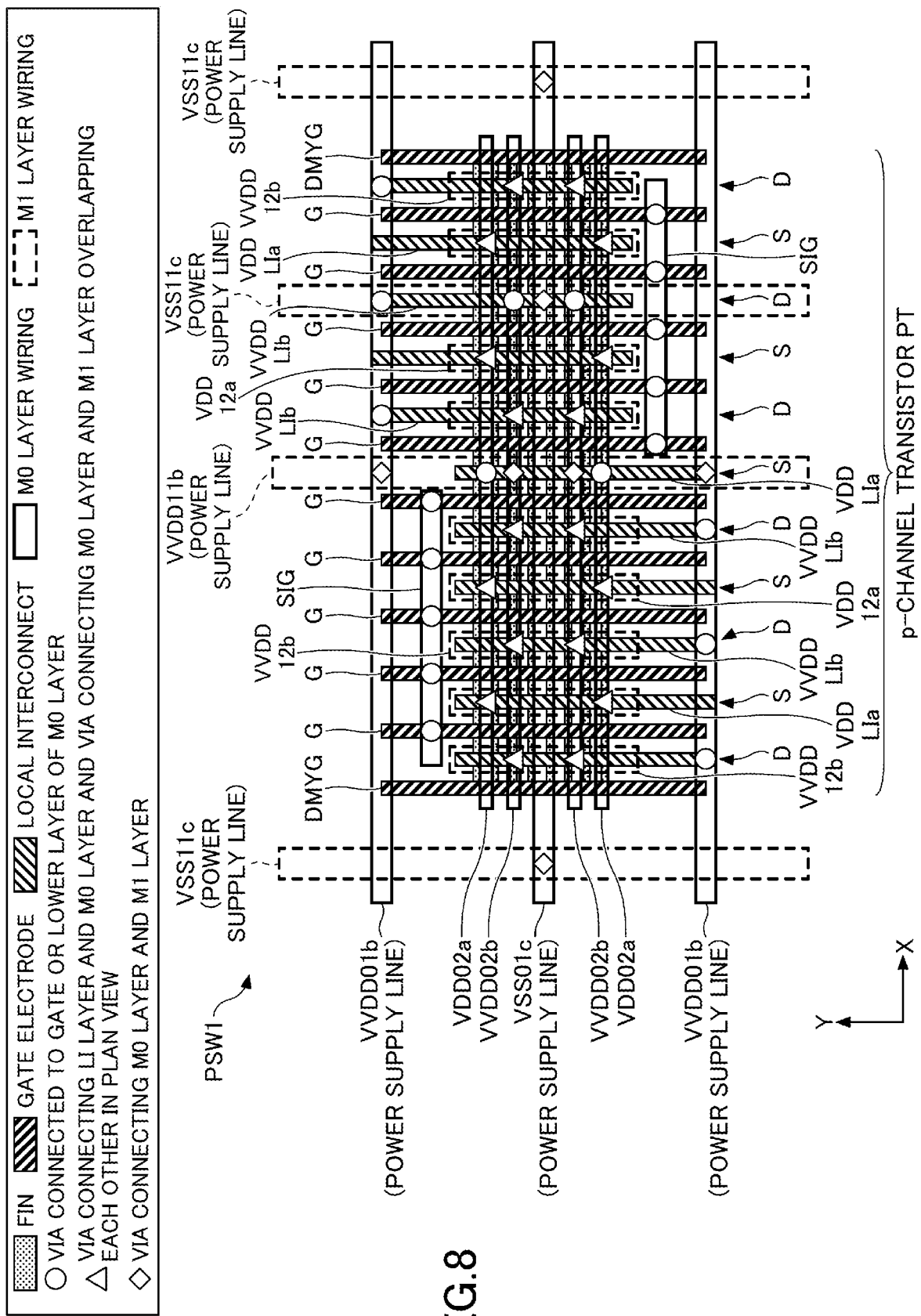
FIG. 8 is a diagram depicting an example of a layout of a power supply wiring of a power switch circuit of a semiconductor device according to a third embodiment.

FIG. 8 is a diagram illustrating an example of a layout of a power switch circuit of a semiconductor device according to a third embodiment. For an element similar to that in FIGS. 3 and 7, the same reference numeral is assigned and a detailed description will be omitted. A layout of the semiconductor device having the power switch circuit PSW1 illustrated in FIG. 8 is similar to the layout of the semiconductor device 100 illustrated in FIG. 1. That is, the semiconductor device having the power switch circuit PSW1 illustrated in FIG. 8 has a standard cell area SCA in which a plurality of standard cells are disposed in a power domain PD, and the power switch circuit PSW1 is disposed in the standard cell area SCA.

In the third embodiment, on the power switch circuit PSW1, in addition to the power supply line VVDD11b of the M1 layer extending in the Y-direction, the power supply line VSS11c of the M1 layer extending in the Y-direction is wired onto the p-channel transistor PT. In the M1 layer, the wiring VVDD12b or wiring VDD12a is disposed at a position on the p-channel transistor PT to avoid the power supply line VSS11c. The local interconnect VVDDLIb located below the power supply line VSS11c is connected to the wiring VVDD02b extending in the X-direction through a via. The wiring VVDD02b is connected to the wiring VVDD12b extending in the Y-direction on the p-channel transistor PT.

The wiring VVDD12b is electrically connected to the power supply line VVDD01b and the power supply line VVDD11b. In other words, the local interconnect VVDDLIb located below the power supply line VSS11c is electrically connected to the power supply line VVDD01b and the power supply line VVDD11b. The power supply line VSS01c is connected to the power supply line VSS11c on the p-channel transistor PT through a via connecting the M0 layer and the M1 layer, and to the power supply line VSS11c disposed at a position that does not overlap the p-channel transistor PT in a plan view.

For example, when the power switch circuit PSW1 becomes large, a plurality of power supply lines or ground lines extending in the Y-direction may overlap the power switch circuit PSW1. In such a case, the power supply line VSS11c can be additionally disposed at a position overlapping the p-channel transistor PT of the power switch circuit PSW1 by providing an area in which the wiring VDD12a or the wiring VVDD12b is not disposed in the power switch circuit PSW1 as in the third embodiment.

Also in the third embodiment, in the same manner as in FIG. 7, the power supply line VVDD11b of the M1 layer disposed in the central portion of the power switch circuit PSW1 in the X-direction is connected to the wiring VVDD02b of the M0 layer extending in the X-direction via diamond shaped vias. Incidentally, the layout in which the wiring of the M1 layer and vias between the M0 layer and the M1 layers are excluded from the layout in FIG. 8 is the same as that in FIG. 4.

As described above, also in the third embodiment, the same effect as in the above-described embodiments can be obtained. Further, in the third embodiment, the power supply line VSS11c of the M1 layer is wired on the power switch circuit PSW1, so that the power supply resistance of the mesh-shaped power supply line VSS to which the power supply voltage VSS is supplied can be reduced. Thus, the extraction capability of the power supply voltage VSS extracted from the standard cell through the power supply line VSS can be enhanced.

In addition, even when the power supply line VSS of the M1 layer is wired on the power switch circuit PSW1, the power supply voltage VVDD can be supplied with certainty to the drain region D located below the power supply line VSS. As a result, the extraction capability to extract the power supply voltage VSS can be enhanced without degrading the capability supply of the power supply voltage VVDD to the standard cell.

Fourth Embodiment

Figure 9:
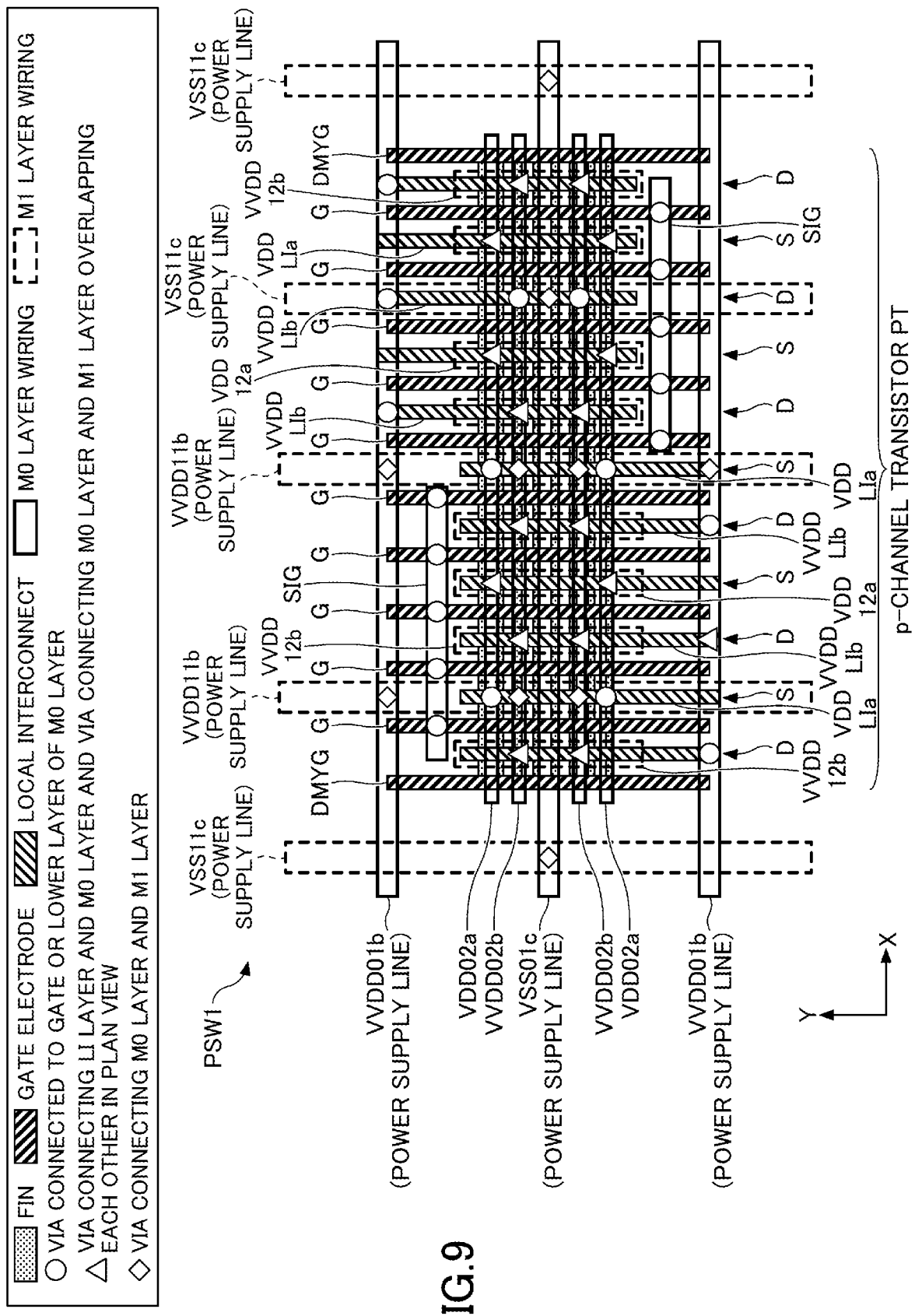
FIG. 9 is a diagram depicting an example of a layout of a power supply wiring of a power switch circuit of a semiconductor device according to a fourth embodiment.

FIG. 9 is a diagram illustrating an example of a layout of a power switch circuit of a semiconductor device according to a fourth embodiment. For an element similar to that in FIGS. 3, 7 and 8, the same reference numeral is assigned and a detailed description will be omitted. A layout of the semiconductor device having the power switch circuit PSW1 illustrated in FIG. 9 is similar to the layout of the semiconductor device 100 illustrated in FIG. 1. That is, the semiconductor device having the power switch circuit PSW1 illustrated in FIG. 9 has a standard cell area SCA in which a plurality of standard cells are disposed in a power domain PD, and the power switch circuit PSW1 is disposed in the standard cell area SCA.

In this embodiment, on the power switch circuit PSW1, in addition to the power supply line VVDD11b of the M1 layer extending in the Y-direction and located in the central portion of the power switch circuit PSW1 in the X-direction, another power supply line VVDD11b of the M1 layer extending in the Y-direction and the power supply line VSS11c of the M1 layer extending in the Y-direction are wired on the p-channel transistor PT. In the M1 layer, the wiring VVDD12b or the wiring VDD12a is located on the p-channel transistor PT at a position that avoids the other power supply line VVDD11b and the power supply line VSS11c.

The local interconnect VVDDLIb located below the power supply line VSS11c is connected to the wiring VVDD02b extending in the X-direction through the via. The wiring VVDD02b is connected to the wiring VVDD12b extending in the Y-direction on the p-channel transistor PT. The wiring VVDD12b is electrically connected to the power supply line VVDD01b and the power supply line VVDD11b. The local interconnect VDDLIa located below the other power supply line VVDD11b is connected to the wiring VDD02a extending in the X-direction through the via. The wiring VDD02a is connected to the wiring VDD12a extending in the Y-direction on the p-channel transistor PT. The wiring VVDD12a is supplied with the power supply voltage VDD, e.g., via wiring of the layer above the M1 layer.

In the same manner as that in FIGS. 3 and 8, the local interconnect VDDLIa located overlapping the power supply line VVDD11b of the M1 layer or the power supply line VSS11c is connected to the wiring VDD02a of the M0 layer extending in the X-direction through the via. Also, the wiring VVDDLIb overlapping the power supply line VVDD11b of the M1 layer or the power supply line VSS11c is connected through vias to the wiring VVDD02b of the M0 layer extending in the X-direction and the wiring VVDD12b of the M1 layer extending in the Y-direction. The wiring VVDD12b is electrically connected to the power supply line VVDD01b and power supply line VVDD11b. Incidentally, the layout in which the wiring of the M1 layer and the via between the M0 layer and the M1 layer are excluded from the layout in FIG. 9 is the same as that in FIG. 4.

By wiring a plurality of power supply lines VVDD11b of the M1 layer on the power switch circuit PSW1, the resistance of the power supply of the mesh-shaped power supply line, to which the power supply voltage VVDD is supplied, can be reduced. Thus, the supply capability of the power supply voltage VVDD to be supplied to the standard cell through the power supply line VVDD11b of the M1 layer can be enhanced, compared to the power switch circuit PSW1 illustrated in FIG. 3.

Additionally, by wiring the power supply line VVDD11b of the M1 layer on the p-channel transistor PT, the supply capability of the power supply voltage VVDD to be supplied to the standard cell can be enhanced. Incidentally, as the size of the power switch circuit PSW1 in the X-direction increases, the number of the power supply lines VVDD11b and VSS11c of the M1 layer extending across the power switch circuit PSW1 tends to increase. Also in this case, the layout method illustrated in FIG. 9 can be applied to improve the capability of supplying the power supply voltage VVDD to the standard cell and the capability of extracting the power supply voltage VSS from the standard cell.

In the example illustrated in FIG. 9, the power supply line VSS11c, the power supply line VVDD11b, the power supply line VVDD11b, the power supply line VSS11c, and the power supply line VSS11c are arranged in the X-direction in this order. However, the present invention is not limited thereto. For example, a power supply line VSS11c or a group of power supply lines VSS11c and a power supply line VVDD11b or a group of power supply lines VVDD11b may be alternately disposed in the X-direction. The same may apply to the third embodiment.

As described above, also in this embodiment, the same effect as that in the above-described embodiments can be obtained. In the fourth embodiment, the power supply resistance of the mesh-shaped power supply line VVDD can be reduced by wiring a plurality of power supply lines VVDD of the M1 layer on the power switch circuit PSW1. Thus, the supply capability of the power supply voltage VVDD to be supplied to the standard cell through the power supply line VVDD of the M1 layer can be enhanced, compared to the above-described embodiments. Additionally, by wiring the power supply line VVDD11b of the M1 layer on the p-channel transistor PT, the supply capability of the power supply voltage VVDD to be supplied to the standard cell can be further enhanced.

Fifth Embodiment

Figure 10:
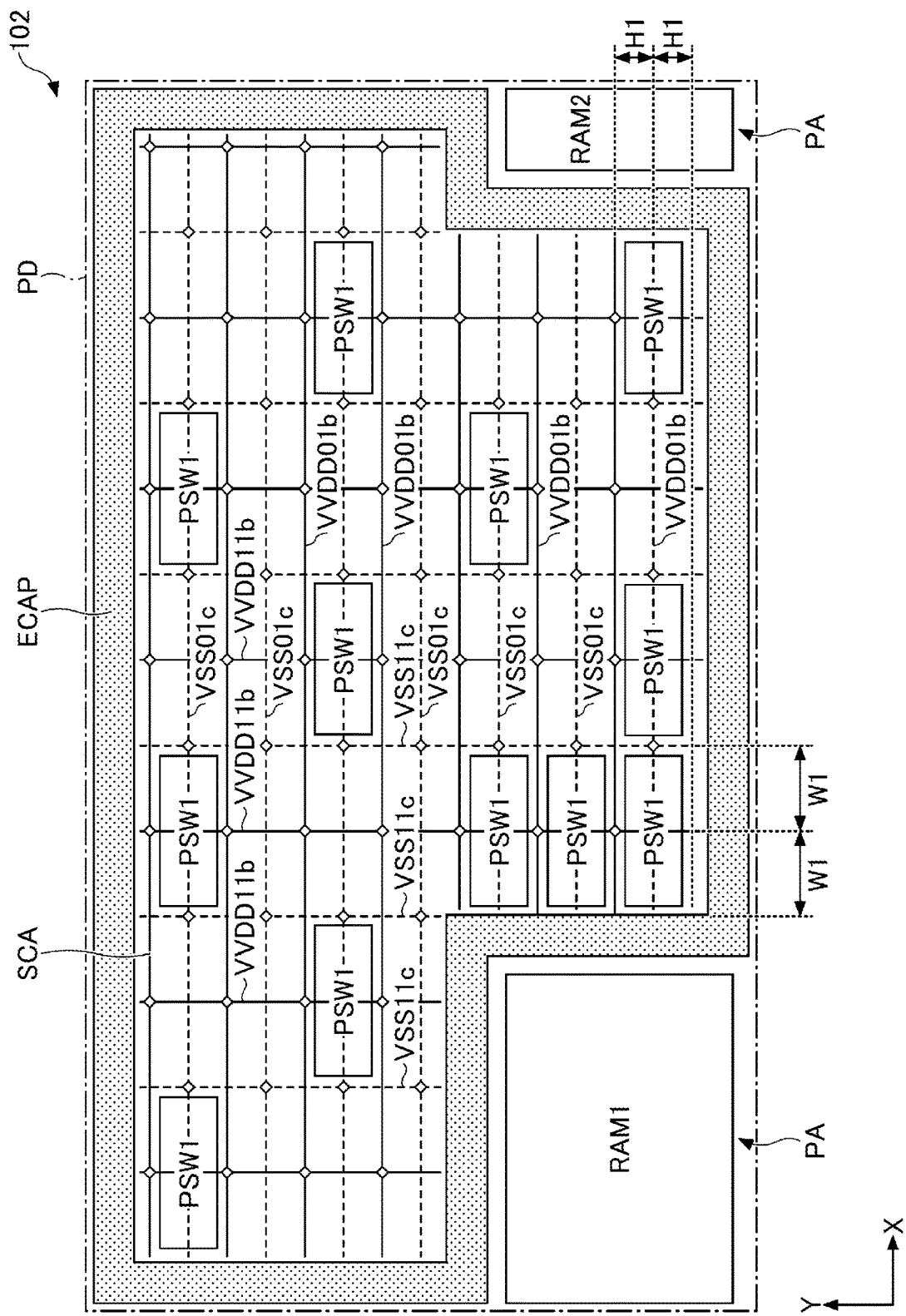
FIG. 10 is a diagram depicting an example of a layout of a semiconductor device according to a fifth embodiment.

FIG. 10 is a diagram illustrating an example of a layout of a semiconductor device according to a fifth embodiment. For an element similar to that in FIG. 1, the same reference numeral is assigned, and a detailed description will be omitted. A semiconductor device 102 illustrated in FIG. 10 has a plurality of peripheral areas PA. In each of the peripheral areas, a large-sized RAM (Random Access Memory) 1 and a small-sized RAM 2 are respectively disposed around an endcap ECAP surrounding a standard cell area SCA in the power domain PD. The RAM 1 and the RAM 2 are examples of functional circuits having predetermined functions. The peripheral area PA is an example of a second region.

In the standard cell area SCA, a plurality of power switch circuits PSW1 are arranged at intervals. In the same manner as in FIG. 1, each power switch circuit PSW1 is positioned in the X-direction at a pitch twice the wiring pitch of the virtual power supply line VVDD (or the ground line VSS) aligned in the X-direction. Each power switch circuit PSW1 is disposed in the Y-direction at a pitch of four times the wiring pitch of the virtual power supply line VVDD (or the ground line VSS) aligned in the Y-direction.

However, in the fifth embodiment, in the standard cell area SCA, a predetermined number of power switch circuits PSW1 is disposed in a region close to the RAM 1 at a pitch smaller than a predetermined pitch. That is, in the standard cell area SCA, the frequency of arrangement of the power switch circuit PSW1 in an area adjacent to the peripheral area PA in which the RAM 1 is disposed is higher than the frequency of arrangement of the power switch circuit PSW1 in other areas. By placing the power switch circuit PSW1 near the RAM 1 in the standard cell area SCA, the capability of supplying the power supply voltage VVDD to the RAM 1 arranged in the power domain PD can be enhanced.

Even when a functional circuit such as the RAM 1 is not disposed around the standard cell area SCA, the frequency of arrangement of the power switch circuits PSW1 may be set to be high, as in the fifth embodiment. Specifically, for example, the power switch circuit PSW1 may be arranged with greater frequency in the corner region within the standard cell area SCA than in the inner region within the standard cell area SCA.

As described above, also in the fifth embodiment, the same effect as those in the above-described embodiments can be obtained. Further, in this embodiment, the appropriate power supply voltage VVDD can be supplied to a predetermined circuit by changing the frequency of arrangement of the power switch circuit PSW1 depending on the amount of power supply voltage VVDD required. In addition, an appropriate power supply voltage VVDD can be provided also for a functional circuit, such as RAM 1, disposed on the peripheral area PA outside the standard cell area SCA.

Sixth Embodiment

Figure 11:
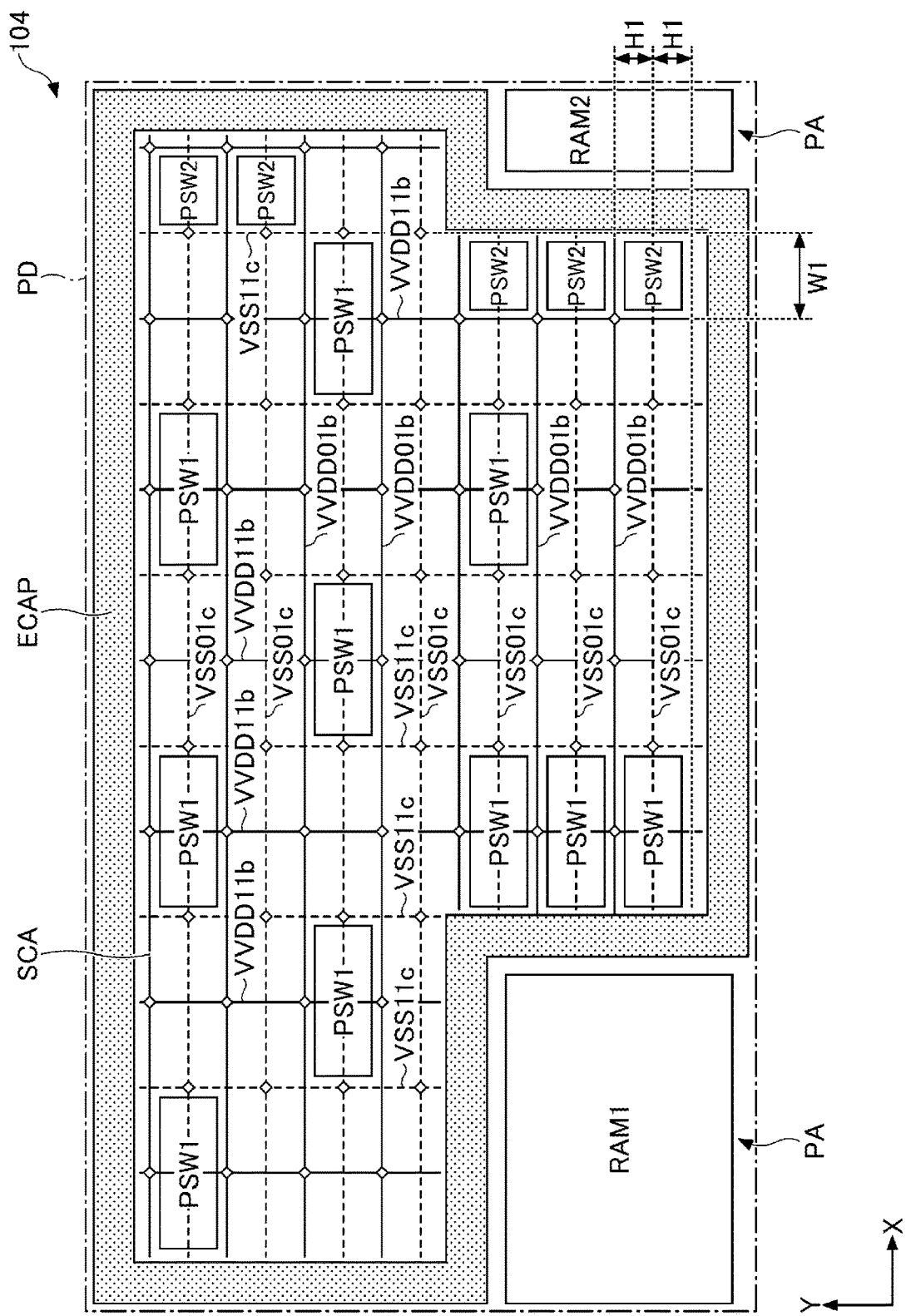
FIG. 11 is a diagram depicting an example of a layout of a semiconductor device according to a sixth embodiment.

FIG. 11 is a diagram illustrating an example of a layout of a semiconductor device according to a sixth embodiment. For an element similar to that in FIGS. 1 and 10, the same reference numeral is assigned, and a detailed description will be omitted. In the semiconductor device 104 illustrated in FIG. 11, a plurality of power switch circuits PSW2, each having a layout size smaller than that of the power switch circuit PSW1, are disposed at the end of the power domain PD on the side of the RAM 2 in the X-direction. The configuration excluding the power switch circuit PSW2 is the same as that in FIG. 10. The power switch circuit PSW2 is an example of a second power switch circuit.

The power switch circuit PSW2 is assumed to have a size in the X-direction less than or equal to the interval W1. Thus, the power switch circuit PSW2 can be disposed at a position that does not overlap the power supply lines VVDD11b and VSS11c extending in the Y-direction in a plan view. Therefore, a competition of the wiring VVD12a of the M1 layer and the wiring VVDD12b on the p-channel transistor PT with the power supply lines VVDD11b and VSS11c extending in the Y-direction does not occur.

In addition, even when there is no space to place the power switch circuit PSW1 within the standard cell area SCA, the power switch circuit PSW2 can be placed near the RAM 2. In particular, the power switch circuit PSW2 can be disposed at the periphery within the standard cell area SCA. As a result, the capability to supply the power supply voltage VVDD to the RAM 2 located in the power domain PD can be enhanced, for example.

FIG. 12 is a diagram illustrating an example of the layout of the power supply wiring of the power switch circuit PSW2 illustrated in FIG. 11. For an element similar to FIG. 3, the same reference numeral is assigned, and a detailed description will be omitted. In FIG. 12, the power switch control circuit that generates a control voltage output to the signal line SIG connected to the gate electrode G of the power switch circuit PSW2 is omitted. Functions and operations of the power switch control circuit controlling the operation of the power switch circuit PSW2 are the same as the functions and the operations of the power switch control circuit PCNT1 illustrated in FIG. 2. In the example of FIG. 12, the power supply line VSS11c extending in the Y-direction is wired to the left side, and the power supply line VVDD11b extending in the Y-direction is wired to the right side. However, the present invention is not limited thereto.

The power switch circuit PSW2 has a plurality of p-channel transistors PT each having eight fins extending in the X-direction and four gate electrodes G extending in the Y-direction. The dummy gate electrode DMYG is disposed on both sides in the X-direction of an arrangement area of the four gate electrodes G.

The power switch circuit PSW2 is the same as the power switch circuit PSW1 illustrated in FIG. 3, except that the p-channel transistor PT having four gate electrodes G is arranged instead of the p-channel transistor PT having ten gate electrodes G. That is, in the p-channel transistor PT, wirings and vias connected to the gate electrode G, the source region S, and the drain region D are the same as those in FIG. 3. The power switch circuit PSW2 is arranged so that the positional relationship with the power supply line VVDD and VSS is the same. Therefore, the layout data of the power switch circuit PSW2 can be made common, and the layout design of the power switch circuit PSW1 can be facilitated.

As described above, also in the sixth embodiment, the same effect as those in the above-described embodiments can be obtained. In the sixth embodiment, the power switch circuit PSW2, which is smaller in size than the power switch circuit PSW1, can be disposed at the periphery within the standard cell area SCA where the power switch circuit PSW1 cannot be disposed. As a result, the capability to supply the power supply voltage VVDD to the RAM 2 located in the power domain PD can be enhanced, for example.

In the above-described embodiment, examples in which the present application is applied to the power switch circuits PSW1 and PSW2 having finFETs are described. However, the present invention may be applied to power switch circuits having planar transistors, nanowire transistors, nanosheet transistors, forksheet transistors, complementary FETs (CFETs), vertical nanowire transistors, or the like.

As described above, preferred embodiments of the present invention have been described in detail. However, it should be noted that the present invention is not limited to the requirements shown in the embodiments. The embodiments can be modified without departing from the spirit of the present invention, and can be appropriately defined according to its application.

What is claimed is:

1. A semiconductor device comprising:
   a first power supply line formed in a first wiring layer and extending in a first direction in a plan view;
   a second power supply line formed in the first wiring layer and extending in the first direction;
   a third power supply line formed in a second wiring layer provided above the first wiring layer, extending in a second direction different from the first direction in the plan view, and connected to the first power supply line;
   a fourth power supply line formed in the second wiring layer, extending in the second direction, and connected to the second power supply line;
   a fifth power supply line formed in the first wiring layer; and
   a first power switch circuit including a transistor provided between the first power supply line and the fifth power supply line,
   wherein the transistor is positioned in the plan view overlapping one of or both of the third power supply line and the fourth power supply line, and
   wherein the first power switch circuit includes
      a first wiring formed in the second wiring layer, electrically connected to a source region of the transistor and to the fifth power supply line, extending in the second direction, and overlapping neither the third power supply line nor the fourth power supply line in the plan view above the transistor, and
      a second wiring formed in the second wiring layer, electrically connected to a drain region of the transistor and to the third power supply line, extending in the second direction, and overlapping neither the third power supply line nor the fourth power supply line in the plan view above the transistor.

2. The semiconductor device according to claim 1, wherein the first power switch circuit further includes a third wiring extending in the first direction above the transistor, and electrically connected to the drain region and to the second wiring, and wherein the third power supply line is connected to the third wiring through a via above the transistor.

3. The semiconductor device according to claim 1, wherein the fourth power supply line is connected to the second power supply line through a via above the transistor.

4. The semiconductor device according to claim 1, comprising:
   a plurality of the third power supply lines;
   a plurality of the fourth power supply lines; and
   a plurality of the first power switch circuits, wherein;
   the plurality of the third power supply lines and the plurality of the fourth power supply lines are repeatedly arranged at a first pitch in the first direction, and
   a relative position at which the transistor overlaps at least one of the third power supply line and the fourth power supply line in the plan view is the same for each of the plurality of the first power switch circuits.

5. The semiconductor device according to claim 1, further comprising:
   a first region including the first power supply line, the second power supply line, the third power supply line, the fourth power supply line, wherein:
   a plurality of the first power switch circuits are provided in the first region, a logic circuit is disposed in the first region, and
   the first region includes an area in which a frequency of arrangement of the first power switch circuit is higher than a frequency of arrangement of the first power switch circuit in other areas.

6. The semiconductor device according to claim 5, further comprising:
   a second region disposed adjacent to the first region and including a functional circuit different from the logic circuit,
   wherein the area, in which the frequency of arrangement of the first power switch circuit is high, is adjacent to the second region.

7. The semiconductor device according to claim 5, further comprising:
   a second power switch circuit disposed in the first region, and including a transistor overlapping neither the third power supply line nor the fourth power supply line.

8. The semiconductor device according to claim 1, wherein the transistor is a finFET.

9. The semiconductor device according to claim 1, further comprising:
   a first region including the first power supply line, the second power supply line, the third power supply line and the fourth power supply line; and
   a plurality of the first power switch circuits provided in the first region, wherein:
   a logic circuit is disposed in the first region, and
   the first region includes an area in which an arrangement pitch of first power switch circuits is smaller than an arrangement pitch of first power switch circuits in other areas.

10. The semiconductor device according to claim 9, further comprising:
    a second region disposed adjacent to the first region and including a functional circuit different from the logic circuit,
    wherein the area is adjacent to the second region.

11. The semiconductor device according to claim 9, further comprising:

a second power switch circuit disposed in the first region, and including a transistor overlapping neither the third power supply line nor the fourth power supply line.

\* \* \* \* \*